US011609245B2

(12) United States Patent
Park et al.

(10) Patent No.: US 11,609,245 B2
(45) Date of Patent: Mar. 21, 2023

(54) TEST DEVICE

(71) Applicant: LEENO INDUSTRIAL INC., Busan (KR)

(72) Inventors: Dong-hoon Park, Yangsan-si (KR); Jae-hwan Jeong, Busan (KR)

(73) Assignee: LEENO INDUSTRIAL INC., Busan (KR)

( * ) Notice: Subject to any disclaimer, the term of this patent is extended or adjusted under 35 U.S.C. 154(b) by 0 days.

(21) Appl. No.: 17/041,871

(22) PCT Filed: May 22, 2019

(86) PCT No.: PCT/KR2019/006140
§ 371 (c)(1),
(2) Date: Sep. 25, 2020

(87) PCT Pub. No.: WO2019/225967
PCT Pub. Date: Nov. 28, 2019

(65) Prior Publication Data
US 2021/0132114 A1 May 6, 2021

(30) Foreign Application Priority Data

May 25, 2018 (KR) .................. 10-2018-0059911

(51) Int. Cl.
*G01R 1/04* (2006.01)
*G01R 1/067* (2006.01)
(Continued)

(52) U.S. Cl.
CPC ..... *G01R 1/06772* (2013.01); *G01R 1/06705* (2013.01); *G01R 1/18* (2013.01)

(58) Field of Classification Search
CPC .......... G01R 1/04; G01R 1/067; G01R 1/073; G01R 1/07342; G01R 1/06722;
(Continued)

(56) References Cited

U.S. PATENT DOCUMENTS 6,037,787 A * 3/2000 Corwith ............. G01R 1/07371
324/756.04
10,161,964 B2 * 12/2018 Miyagawa ........... G01R 1/0466
(Continued)

FOREIGN PATENT DOCUMENTS

EP 1303763 A2 4/2003
JP S60 82271 U 6/1985
(Continued)

OTHER PUBLICATIONS

Communication dated Feb. 19, 2021, issued by the European Patent Office in counterpart European Application No. 19807085.6.
(Continued)

*Primary Examiner* — Neel D Shah
(74) *Attorney, Agent, or Firm* — Sughrue Mion, PLLC

(57) ABSTRACT

Disclosed is a test device for testing a high-frequency and high-speed semiconductor. The test device includes a probe supporting block formed with a tube accommodating portion along a test direction; a conductive shield tube accommodated in the tube accommodating portion; and a probe accommodated and supported in the shield tube without contact, the tube accommodating portion including a conductive contact portion for transmitting a ground signal to the shield tube. When a high-frequency and high-speed semiconductor or the like subject is tested, the test device easily and inexpensively prevents crosstalk between the adjacent signal probes and improves impedance characteristic.

7 Claims, 6 Drawing Sheets

(51) Int. Cl.
*G01R 1/073* (2006.01)
*G01R 1/18* (2006.01)
*G01R 3/00* (2006.01)
*G01R 31/28* (2006.01)

(58) Field of Classification Search
CPC . G01R 1/18; G01R 3/00; G01R 31/02; G01R 31/28; H01R 33/76; H01R 13/24
See application file for complete search history.

(56) References Cited

U.S. PATENT DOCUMENTS

| | | | | |
|---|---|---|---|---|
| 2004/0061513 A1* | 4/2004 | Sweet | ............... | G01R 1/06772 324/755.05 |
| 2008/0088331 A1* | 4/2008 | Yoshida | ............... | G01R 1/0466 324/755.05 |
| 2011/0227596 A1* | 9/2011 | Kazama | ............... | G01R 1/0466 324/756.03 |
| 2013/0065455 A1* | 3/2013 | Kawata | ............... | H01L 23/32 439/700 |

FOREIGN PATENT DOCUMENTS

| | | |
|---|---|---|
| JP | 8-111438 A | 4/1996 |
| JP | 2004-177400 A | 6/2004 |
| JP | 2006-098375 A | 4/2006 |
| JP | 2007-178163 A | 7/2007 |
| JP | 2007-198835 A | 8/2007 |
| JP | 2008-70146 A | 3/2008 |
| JP | 2011-252766 A | 12/2011 |
| JP | 2016-102696 A | 6/2016 |
| KR | 2001-0041554 A | 5/2001 |
| KR | 10-2008-0024084 A | 3/2008 |
| KR | 10-1534778 B1 | 7/2015 |
| TW | 201641940 A | 12/2016 |
| TW | 201734465 A | 10/2017 |

OTHER PUBLICATIONS

International Search Report for PCT/KR2019/006140 dated Sep. 3, 2019 [PCT/ISA/210].
Written Opinion for PCT/KR2019/006140 dated Sep. 3, 2019 [PCT/ISA/237].
Korean Office Action of 10-2018-0059911 dated Mar. 20, 2019.
Korean Notice of Allowance of 10-2018-0059911 dated Aug. 8, 2019.
Taiwanese Office Action for 108117589 dated Dec. 16, 2019.
Taiwanese Notice of Allowance for 108117589 dated Apr. 24, 2020.
Communication dated Nov. 2, 2021 from the Japanese Patent Office in Japanese Application No. 2021-505173.

* cited by examiner

【Figure 1】
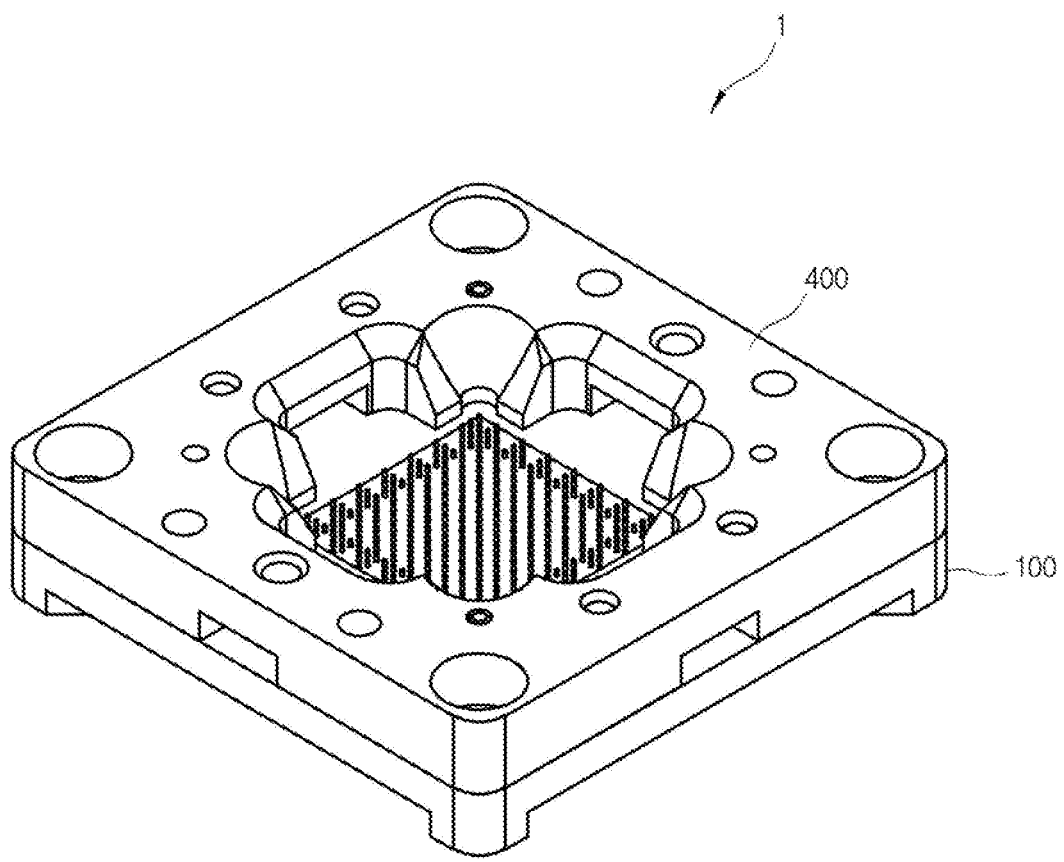

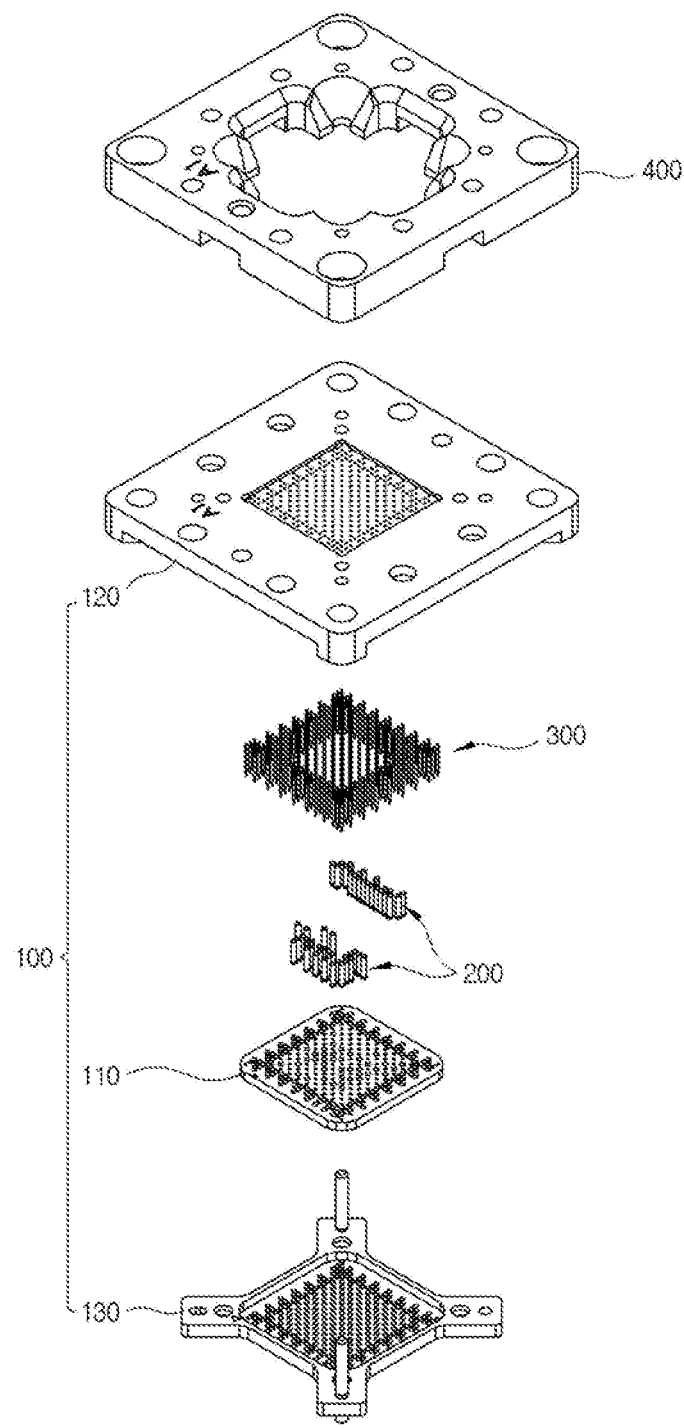
[Figure 2]

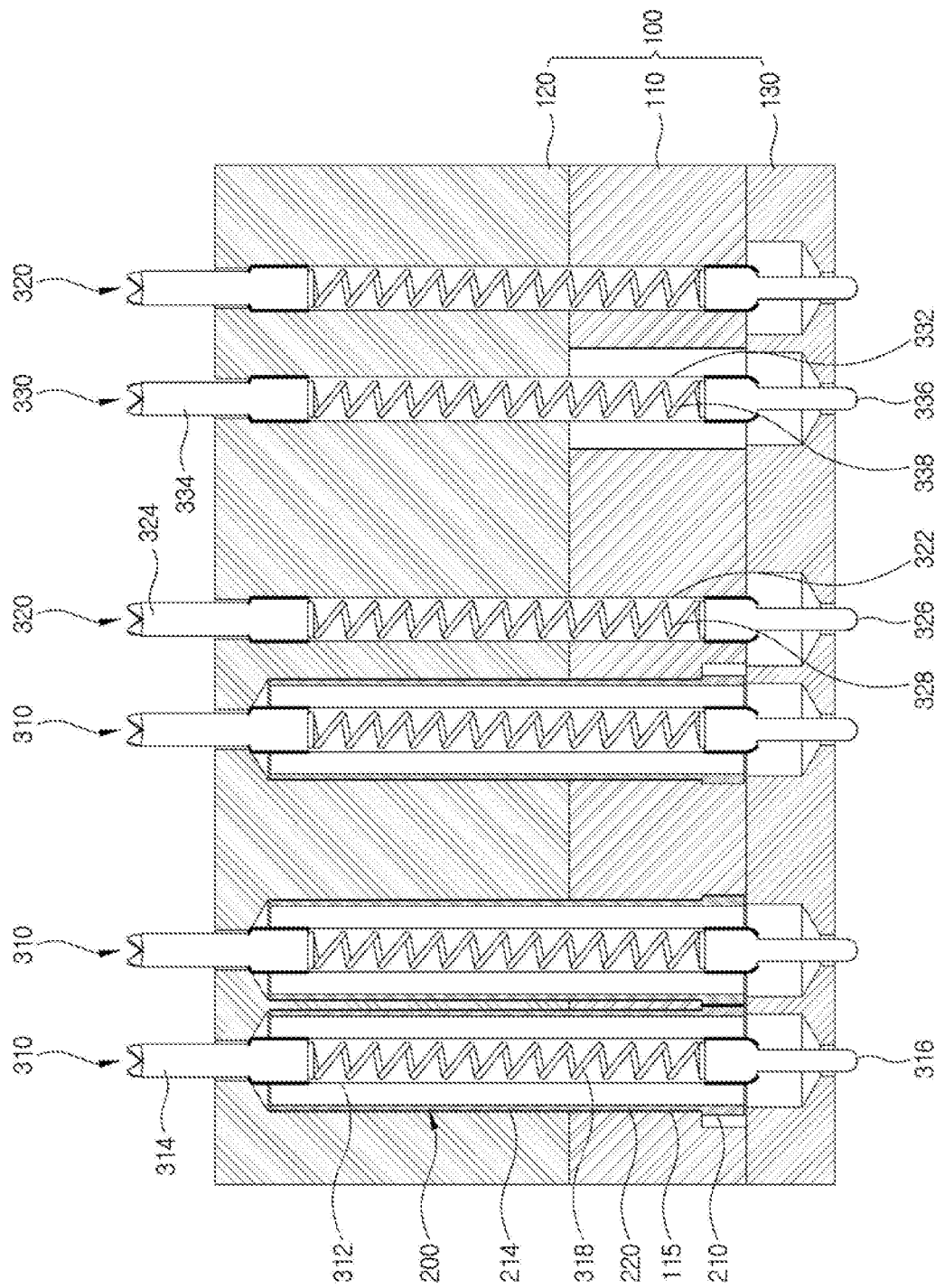

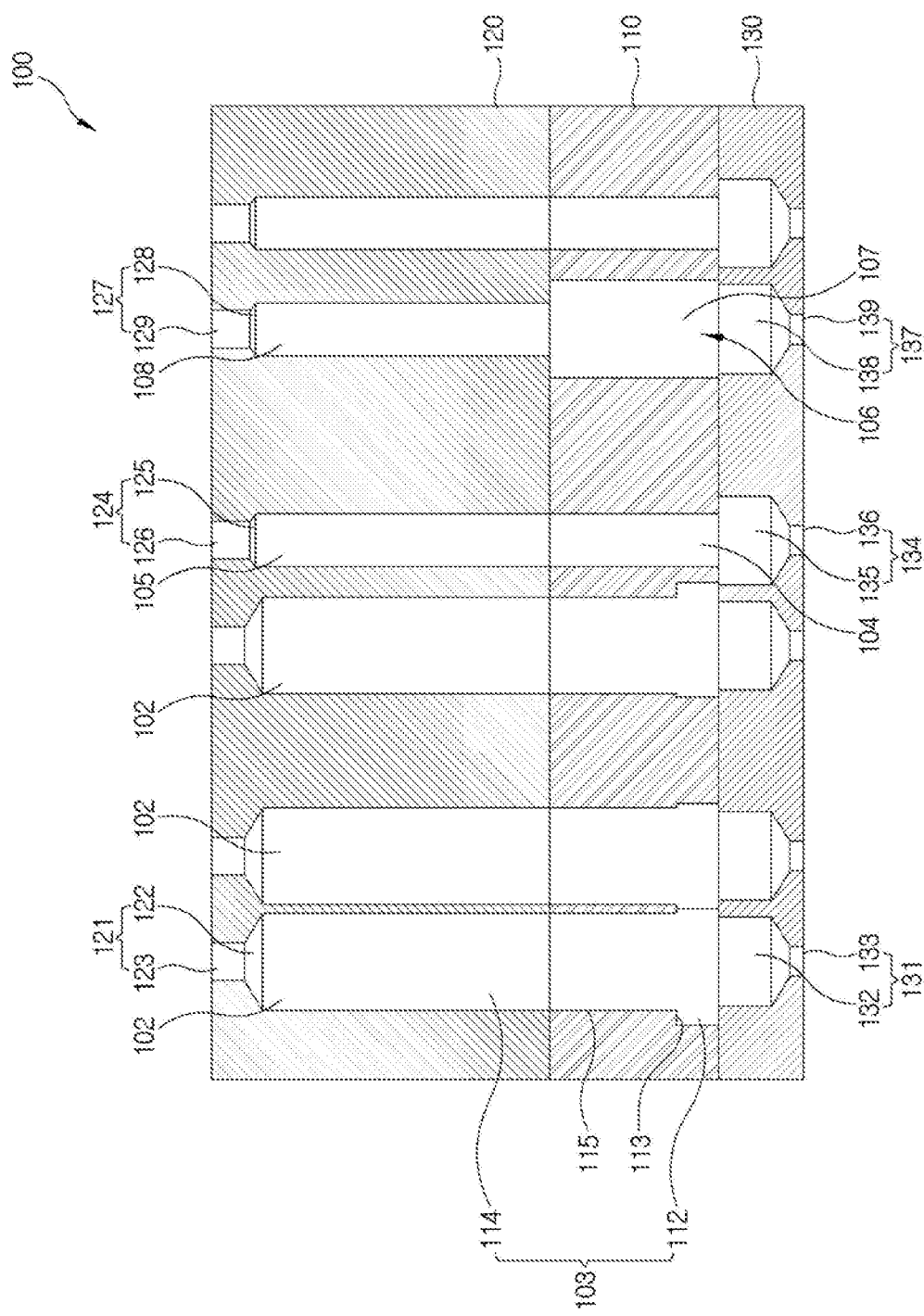
[Figure 4]

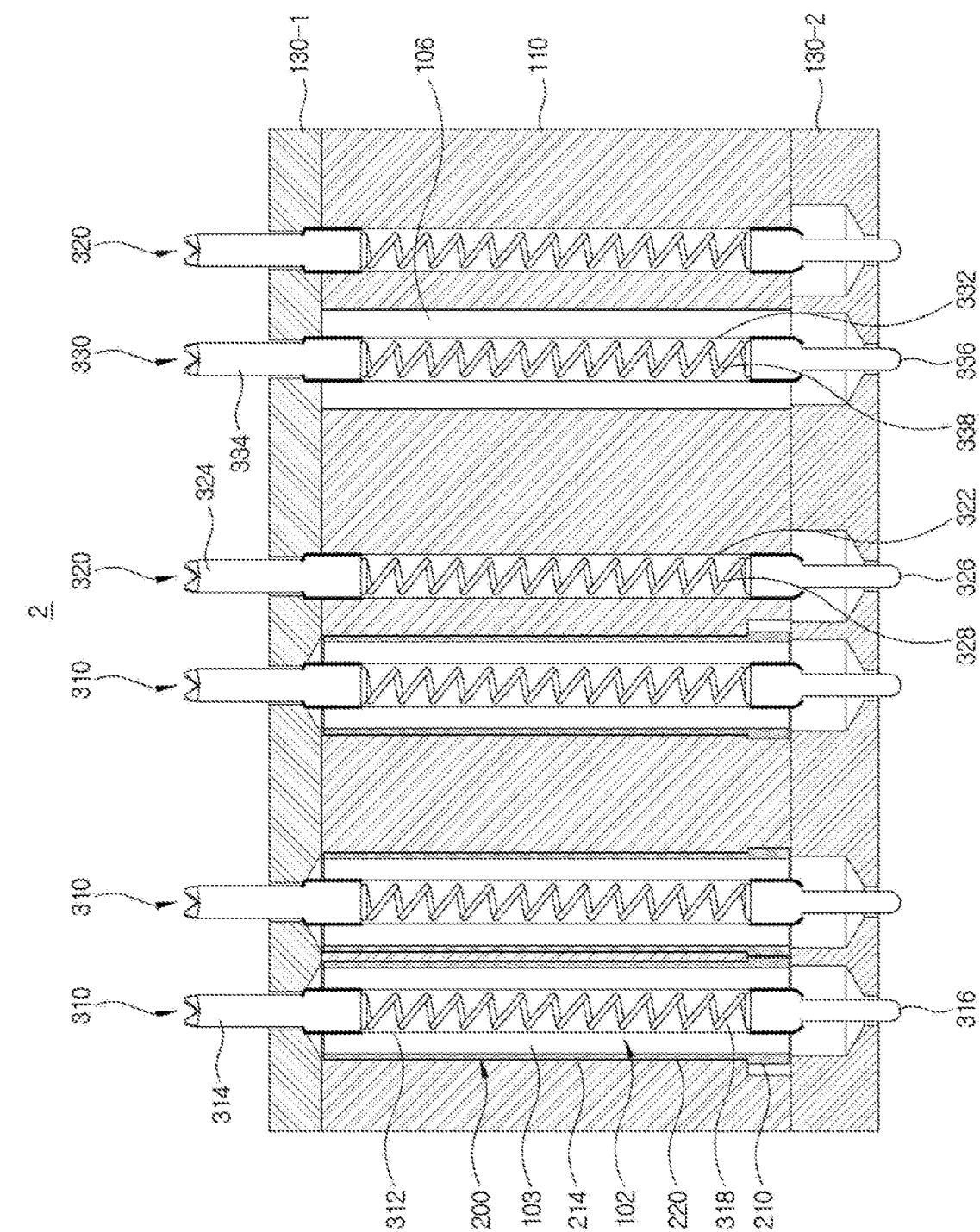
[Figure 5]

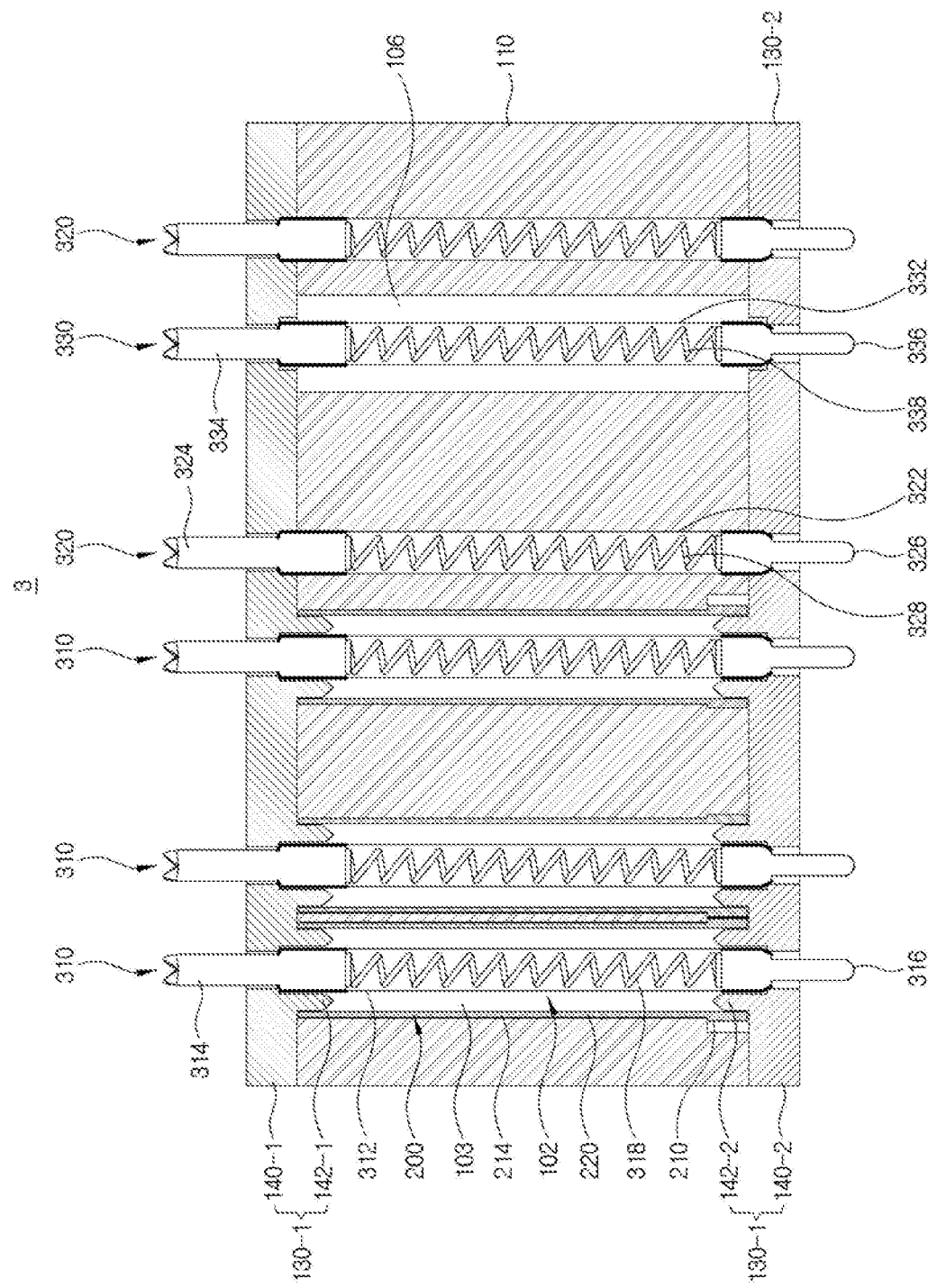
[Figure 6]

TEST DEVICE

TECHNICAL FIELD

The disclosure relates to a test device for a high-frequency and high-speed semiconductor.

BACKGROUND ART

As a test device for a high-frequency or high-speed semiconductor, a high-frequency probe has been used. Such a high-frequency probe is too expensive to be used in a low- and mid-priced test device.

The test device for the high-frequency or high-speed semiconductor includes a conductive block which is contactless-mounted with a signal probe to be shielded against noise from adjacent signal probes. In this case, the signal probe penetrates the conductive block without contacting an inner wall of a probe hole, and both ends of the single probe are supported on insulating plates disposed at the opposite sides of the conductive block. However, such a conventional test device has disadvantages that its material cost is high because one conductive block is applied for the shielding, and processing is difficult when the signal probes are arranged at fine pitches. Further, the processed hole of the conductive block has low precision and a rough inner surface, and therefore there is a problem that signal probe passing therethrough is deteriorated in an impedance characteristic.

DISCLOSURE

Technical Problem

An aspect of the disclosure is conceived to solve the conventional problems, and provides a test device for a high-frequency and high-speed semiconductor, in which noise between adjacent signal probes is effectively blocked by a simple stricture.

Another aspect of the disclosure is to provide a test device for a high-frequency and high-speed semiconductor, which is improved in processing and assembling and reduces costs with a low-priced material.

Technical Solution

In accordance with an embodiment of the disclosure, there is provided a test device. The test device includes a probe supporting block formed with a tube accommodating portion along a test direction; a conductive shield tube accommodated in the tube accommodating portion; and a probe accommodated and supported in the shield tube without contact, the tube accommodating portion including a conductive contact portion for transmitting a ground signal to the shield tube.

The probe supporting block may include: a conductive block including a conductive contact portion with which the shield tube is in contact; an insulating block stacked on one side of the conductive block and supporting the shield tube and a first end portion of the probe; and an insulating cover block covering a rear side of the conductive block and supporting a second end portion of the probe.

The probe supporting block may include: a conductive block including a conductive contact portion with which the shield tube is in contact; and a pair of insulating blocks arranged with the conductive block therebetween and supporting both ends of the shield tube and the probe.

The probe supporting block may include: a conductive block including a conductive contact portion with which the shield tube is in contact; and a pair of insulating cover blocks arranged with the conductive block therebetween and supporting both ends of the probe.

The insulating cover block may include: a cover main body shaped like a plate; and a probe holder protruding from the cover main body, inserted in the shield tube, and supporting both ends of the probe inside the shield tube.

Advantageous Effects

A test device for a high-frequency and high-speed semiconductor according to the present invention can effectively shield the noise between adjacent signal probes with a simple stricture, improve processing and assembling, and reduce costs with a low-priced material.

DESCRIPTION OF DRAWINGS

The above and/or other aspects will become apparent and more readily appreciated from the following description of exemplary embodiments, taken in conjunction with the accompanying drawings, in which:

FIGS. 1 to 3 are a perspective view, an exploded perspective view and a partial cross-section view of a test device according to a first embodiment of the disclosure;

FIG. 4 is a partial cross-section view of a probe supporting block of FIG. 3;

FIG. 5 is a partial cross-section view of a test device according to a second embodiment of the disclosure; and FIG. 6 is a partial cross-section view of a test device according to a third embodiment of the disclosure.

BEST MODE

Below, a test device 1 according to embodiments of the disclosure will be described in detail with reference to the accompanying drawings.

FIGS. 1 to 4 are a perspective view, an exploded perspective view and a partial cross-section view of the test device according to the disclosure, and a cross-section view of a probe supporting block of FIG. 3. As shown therein, the test device 1 includes a probe supporting block 100, a shield tube 200, a probe 300, and an insert 400 configured to accommodate a semiconductor or the like subject to be tested. The probe 300 includes a signal probe 310 for transmitting a test signal, a ground probe 320 for transmitting a ground signal, and a power probe 330 for supplying electric power.

As shown in FIGS. 1 to 4, the probe supporting block 100 includes a tube accommodating portion 103, and a conductive contact portion 115 disposed in the tube accommodating portion 103. The probe supporting block 100 includes a conductive block 110 having the conductive contact portion 115, an insulating block 120 coupled to the top of the conductive block 110, and an insulating cover block 130 coupled to the bottom of the conductive block 110.

The conductive block 110 is made of conductive metal such as brass. The conductive block 110 may be made of an insulator, the surface of which is plated with metal. The conductive block 110 is in contact with the ground probe 320 and is kept grounded.

The insulating block 120 is made of an insulator, for example, polycarbonate, polyimide, polyacrylic, ceramic, etc. The insulating block 120 is coupled to the top of the conductive block 110. The insulating block 120, together with the conductive block 110 and the insulating cover block 130, accommodates and supports the shield tube 200, the signal probe 310, the ground probe 320, and the power probe 330.

The insulating cover block 130 is made of an insulator, for example, polycarbonate, polyimide, polyacrylic, polyvinyl alcohol, etc. The insulating cover block 130, together with the conductive block 110 and the insulating block 120, accommodates and supports the shield tube 200, the signal probe 310, the ground probe 320, and the power probe 330.

The probe supporting block 100 includes a plurality of signal probe holes 102, a plurality of ground probe hole 104, and a plurality of power probe holes 106.

The signal probe hole 102 includes the tube accommodating portion 103, and first and second signal probe support holes 121 and 131, which are formed throughout the coupled conductive and insulating blocks 110 and 120 and accommodate the shield tube 200. Here, the first and second signal probe support holes 121 and 131 are configured to support the signal probe 310 passing through the internal center of the shield tube 200 accommodated in the tube accommodating portion 103.

The tube accommodating portion 103 penetrates the conductive block 110 from the bottom to the top and extends toward the top of the insulating block 120. The tube accommodating portion 103 is formed as long as possible not to penetrate the insulating block 120. The tube accommodating portion 103 includes a flange hole 112 which is formed in a lower end portion of the conductive block 110 and accommodates a flange 210 of the shield tube 200 (to be described later), and a tube main body hole 114 which accommodates the tube main body 220 of the shield tube 200. The flange hole 112 has a greater diameter than the tube main body hole 114. In result, a stepped portion 113 is formed between the flange hole 112 and the tube main body hole 114. The shield tube 200 accommodated in the tube accommodating portion 103 accommodates a barrel 312 of the signal probe 310 therein without contact.

The first signal probe support hole 121 includes a first signal barrel end support hole 122 communicating with the tube accommodating portion 103 in the insulating block 120 and accommodating a first end portion of the barrel 312 of the signal probe 310, and a first signal plunger through hole 123 decreased in radius from the first signal barrel end support hole 122, penetrating the top of the insulating block 120, and accommodating a plunger 314 of the signal probe 310 therein. The first signal barrel end support hole 122 is slantly formed being decreased in radius from the tube main body hole 114 to the first signal plunger through hole 123. The first signal barrel end support hole 122 accommodates and supports the barrel 312 of the signal probe 310. The first signal plunger through hole 123 is formed to allow the upper plunger 314 of the signal probe 310 to pass therethrough and penetrate the top of the insulating block 120.

The second signal probe support hole 131 includes a signal barrel moving hole 132 communicating with the tube accommodating portion 103 in the insulating cover block 130 and allowing the barrel 312 of the signal probe 310 to be movable up and down at a test, and a second signal plunger through hole 133 decreased in radius in the signal barrel moving hole 132, penetrating the bottom of the insulating cover block 130 and accommodating a lower plunger 316 of the signal probe 310 therein. The second signal plunger through hole 133 is formed to allow the lower plunger 316 of the signal probe 310 to pass therethrough and penetrate the bottom of the insulating cover block 130.

The ground probe hole 104 includes a ground barrel hole 105, and first and second ground probe support hole 124 and 134, which are formed throughout the coupled conductive and insulating blocks 110 and 120, and accommodate a barrel 322 of the ground probe 320.

The ground barrel hole 105 has an inner diameter corresponding to an outer diameter of the barrel 322 of the ground probe 320. The ground barrel hole 105 penetrates the conductive block 110 from the bottom to the top and extends toward the top of the insulating block 120. The ground barrel hole 105 is formed as long as possible not to penetrate the insulating block 120. The ground probe 320 is inserted in the ground barrel hole 105, and is in contact with the inner wall of the ground barrel hole 105 of the conductive block 110 thereby grounding the conductive block 110.

The first ground probe support hole 124 includes a first ground barrel end support hole 125 communicating with the ground barrel hole 105 in the insulating block 120 and accommodating a first end portion of the barrel 322 of the ground probe 320, and a first ground plunger through hole 126 decreased in radius in the first ground barrel end support hole 125, penetrating the top of the insulating block 120, and accommodating an upper plunger 324 of the ground probe 320. The first ground barrel end support hole 125 is slantly formed being decreased in radium from the ground barrel hole 105 to the first ground plunger through hole 126. The first ground barrel end support hole 125 accommodates and supports the first end portion of the barrel 322 of the ground probe 320. The first ground plunger through hole 125 is formed to allow the upper plunger 324 of the ground probe 320 to pass therethrough and penetrate the top of the insulating block 120.

The second ground probe support hole 134 includes the ground barrel moving hole 135 communicating with the ground barrel hole 105 in the insulating cover block 130 and allowing the barrel 322 of the ground probe 320 to be movable up and down at a test, and a second ground plunger through hole 136 decreased in radius in the ground barrel moving hole 135, penetrating the bottom of the insulating cover block 130 and accommodating a lower plunger 326 of the ground probe 320. The second ground plunger through hole 136 is formed to allow the lower plunger 326 of the ground probe 320 to pass therethrough and penetrate the bottom of the insulating cover block 130.

The power probe hole 106 includes a power barrel through hole 107 formed in the conductive block 110, a power barrel accommodating hole 108 formed in the insulating block 120, and first and second power probe support holes 127 and 137.

The power barrel through hole 107 has a diameter greater than the outer diameter of a barrel 332 of the power probe 330. The barrel 332 of the power probe 330 passes through the power barrel through hole 107 without contact. The power barrel through hole 107 passes through the conductive block 110 from the bottom to the top.

The power barrel accommodating hole 108 has an inner diameter corresponding to an outer diameter of the barrel 332 of the power probe 330. The power barrel accommodating hole 108 communicates with the power barrel through hole 107, and is formed as long as possible not to penetrate the bottom of the insulating block 120.

The first power probe support hole 127 includes a first power barrel end support hole 128 communicating with the power barrel accommodating hole 108 in the insulating block 120 and accommodating the first end portion of the barrel 332 of the power probe 330, and a first power plunger through hole 129 decreased in radius in the first power barrel end support hole 128, penetrating the top of the insulating block 120 and accommodating an upper plunger 334 of the power probe 330. The first power barrel end support hole 127 is slantly formed being decreased in radius from the power barrel accommodating hole 108 to the first power plunger through hole 129. The first power barrel end support hole 128 accommodates and supports the first end portion of the barrel 332 of the power probe 330. The first power plunger through hole 129 is formed to allow the upper plunger 334 of the power probe 330 to pass therethrough and penetrate the top of the insulating block 120.

The second power probe support hole 137 includes a power barrel moving hole 138 communicating with the power barrel through hole 107 in the insulating cover block 130 and allowing the barrel 332 of the power probe 330 to be movable at a test, and a second power plunger through hole 139 decreased in radius in the power barrel moving hole 138, penetrating the bottom of the insulating cover block 130, and accommodating a lower plunger 336 of the power probe 330. The second power plunger through hole 139 is formed to allow the lower plunger 336 of the power probe 330 to pass therethrough and penetrate the bottom of the insulating cover block 130.

The signal probe 310 includes the barrel 312 shaped like a cylindrical pipe as a pogo pin type, the upper plunger 314 partially inserted in a first side end portion of the barrel 312, the lower plunger 316 partially inserted in a second side end portion of the barrel 312, and a spring 318 interposed between the upper plunger 314 and the lower plunger 316 within the barrel 312 so that at least one of the upper plunger 314 and the lower plunger 316 can elastically slide inside the barrel 312. The signal probe 310 is not limited to the pogo pin type, but may employ any probe as long as it can be elastically retractable. The signal probe 310 is accommodated being spaced apart from the inner wall of the shield tube 200 and supported in the probe supporting block 100.

The ground probe 320 includes the barrel 322 shaped like a cylindrical pipe as a pogo pin type like the signal probe 310, the upper plunger 324 partially inserted in a first side end portion of the barrel 322, the lower plunger 326 partially inserted in a second side end portion of the barrel 322, and a spring 328 interposed between the upper plunger 324 and the lower plunger 326 within the barrel 322 so that at least one of the upper plunger 324 and the lower plunger 326 can elastically slide inside the barrel 322. The signal probe 320 is not limited to the pogo pin type, but may employ any probe as long as it can be elastically retractable. The ground probe 320 is supported in the probe supporting block 100 while being in contact with the conductive block 110.

The power probe 330 includes the barrel 332 shaped like a cylindrical pipe as a pogo pin type like the signal probe 310 or the ground probe 320, the upper plunger 334 partially inserted in a first side end portion of the barrel 332, the lower plunger 336 partially inserted in a second side end portion of the barrel 332, and a spring 338 interposed between the upper plunger 334 and the lower plunger 336 within the barrel 332 so that at least one of the upper plunger 334 and the lower plunger 336 can elastically slide inside the barrel 332. The signal probe 330 is not limited to the pogo pin type, but may employ any probe as long as it can be elastically retractable. The power probe 330 is supported in the probe supporting block 100 while being spaced apart from the conductive block 110.

The shield tube 200 is provided as a metal pipe having good conductivity and manufactured to have a sufficiently greater diameter than the barrel 312 of the signal probe 310. The shield tube 200 is in contact with the conductive contact portion 115 for transmitting a ground signal from the ground probe 320 via the conductive block 110, thereby keeping a ground state. In result, the shield tube 200 makes the plurality of signal probes 310 passing through the conductive block 110 and the insulating block 120 be shielded against noise between them.

At this time, by forming the conductive block 110 to the minimum size and the insulating block 120 to the maximum size, the grounded shield tube 200 passing through the insulating block 120 shields the adjacent signal probes 310 against crosstalk between them, thereby reducing costs of materials and reducing costs of manufacture.

All of the signal probe 310, the ground probe 320 and the power probe 330 described above are actualized by not a conventional special high-frequency dedicated probe but a general pogo pin type probe to test a high-frequency and high-speed semiconductor or the like subject to be tested, thereby reducing manufacture costs.

FIG. 5 is a partial cross-section view of a test device 2 according to a second embodiment of the disclosure. As shown therein, the test device 2 includes a probe supporting block 100, a shield tube 200, a signal probe 310, a ground probe 320, and a power probe 330.

The probe supporting block 100 includes a conductive block 110, a first insulating cover block 130-1 coupled to the top of the conductive block 110, and a second insulating cover block 130-2 coupled to the bottom of the conductive block 110.

The conductive block 110 is made of conductive metal such as brass. The conductive block 110 may be made of an insulator, the surface of which is plated with metal. The conductive block 110 is in contact with the ground probe 320 and is kept grounded.

The first and second insulating cover blocks 130-1 and 130-2 are made of an insulator, for example, polycarbonate, polyimide, polyacrylic, polyvinyl alcohol, etc. The first and second insulating cover blocks 130-1 and 130-2 arranged with the conductive block 110 between them supports both ends of the signal probe 310, the ground probe 320, and the power probe 330.

The shield tube 200, the signal probe 310, the ground probe 320 and the power probe 330 are equivalent to those of the test device 1 according to the first embodiment, and therefore repetitive descriptions thereof will be avoided.

In the foregoing test device 2 according to the second embodiment, the shield tube 200 is inserted in the signal probe hole 102 throughout the conductive block 110, and the signal probe 310 passes through the center of the shield tube 200 without contact. The shield tube 200 has an even surface of an inner wall so that the signal probe 310 can be uniformly spaced apart from the shield tube 200, thereby showing good impedance characteristics.

FIG. 6 is a partially enlarged cross-section view of a test device 3 according to a third embodiment of the disclosure. Below, the same elements as those of the test device 2 according to the second embodiment shown in FIG. 3 will be given the same reference numerals, and repetitive descriptions thereof will be avoided.

As shown therein, the test device 3 includes a probe supporting block 100, a shield tube 200, a signal probe 310, a ground probe 320, and a power probe 330. The test device 3 may include an insert to accommodate a semiconductor or the like subject to be tested.

The probe supporting block 100 includes a conductive block 110, a first insulating cover block 130-1 coupled to the top of the conductive block 110, and a second insulating cover block 130-2 coupled to the bottom of the conductive block 110.

The conductive block 110 is made of conductive metal such as brass. The conductive block 110 may be made of an insulator, the surface of which is plated with metal. The conductive block 110 is in contact with the ground probe 320 and is kept grounded.

The first and second insulating cover blocks 130-1 and 130-2 are made of an insulator, for example, polycarbonate, polyimide, polyacrylic, polyvinyl alcohol, etc. The first and second insulating cover blocks 130-1 and 130-2 arranged with the conductive block 110 between them supports both ends of the signal probe 310, the ground probe 320, and the power probe 330.

The first and second insulating cover blocks 130-1 and 130-2 respectively include first and second cover main bodies 140-1 and 140-2 shaped like plates, and first and second probe holders 142-1 and 142-2 integrally protruding from the first and second cover main bodies 140-1 and 140-2. The first and second probe holders 142-1 and 142-2 are inserted in the shield tube 200 and hold both ends of the signal probe 310 without contacting the inner wall of the shield tube 200.

The first and second cover main bodies 140-1 and 140-2 shaped like plates may be thinner than the first and second insulating cover blocks 130-1 and 130-2 of the test device 2 according to the second embodiment. This is possible because both ends of the signal probe 310 are supported by the first and second probe holders 142-1 and 142-2 inserted in the shield tube 200. In result, the shield tube 200 is formed as long as possible with respect to the whole thickness of the probe supporting block 100, thereby minimizing crosstalk between the adjacent signal probes 310.

Further, the first and second probe holders 142-1 and 142-2 are forcibly fitted to both ends of the shield tube 200 and serve to hold and support the first and second insulating cover blocks 130-1 and 130-2 on the top and bottom of the conductive block 110. Of course, the first and second insulating cover blocks 140-1 and 140-2 may be attached to the top and bottom of the conductive block 110 by a screw, adhesive and the like. Although it is not illustrated, the first and second probe holders 142-1 and 142-2 may be formed in the insulating cover block 130 shown in FIGS. 3 to 5.

In the test device according to the disclosure, the general signal probe such as a pogo pin passes through the inside of the conductive shield tube shaped like a pipe without contact, thereby providing the following advantages.

First, the signal probe is uniformly spaced apart from the inner wall of the conductive shield tube, thereby showing good impedance characteristics.

Second, the shield is achieved by the conductive shield tube extended up to the insulating block in the state that the conductive block becomes thinner and the insulating block becomes thicker, thereby reducing manufacture costs.

Third, the conductive shield tube is disposed throughout the whole thickness of the support block, thereby perfectly decreasing crosstalk between the adjacent signal probes.

Fourth, the general pogo pin is used in the test device dedicated for the high-frequency and high-speed semiconductor, thereby reducing manufacture costs and improving assembling characteristics of the test device.

Although the disclosure is described through a few exemplary embodiments and drawings, the present invention is not limited to the foregoing exemplary embodiments and it will be appreciated by a person having an ordinary skill in the art that various modifications and changes can be made from these embodiments.

Therefore, the scope of the disclosure has to be defined by not the exemplary embodiments but appended claims and the equivalents.

The invention claimed is:

1. A test device comprising:
a probe supporting block formed with a tube accommodating portion along a test direction;
a conductive shield tube accommodated in the tube accommodating portion; and
a probe accommodated and supported in a shield tube without contacting the shield tube,
wherein the probe supporting block comprises a conductive block and an insulating block,
wherein the tube accommodating portion comprises a conductive contact portion for transmitting a ground signal to the shield tube and with which the shield tube is in contact,
wherein the insulating block is stacked on one side of the conductive block and supports the shield tube and a first end portion of the probe, and
wherein the tube accommodating portion is formed so as to penetrate the conductive block from a bottom to a top in the test direction and extends only to a position in the insulating block in the test direction,
wherein the conductive block comprises the conductive contact portion,
wherein the probe supporting block comprises:
an insulating cover block covering a rear side of the conductive block and
supporting a second end portion of the probe, and
wherein a thickness of the insulating block is different from a thickness of the conductive block and from a thickness of insulating cover block in the test direction.

2. The test device according to claim 1, wherein the probe supporting block further comprises:
the insulating block stacked on one side of the conductive block and supporting the shield tube and the first end portion of the probe.

3. The test device according to claim 1, wherein the probe supporting block further comprises a pair of insulating blocks arranged with the conductive block therebetween and supporting both ends of the shield tube and the probe.

4. The test device according to claim 1, wherein the probe supporting block further comprises a pair of insulating cover blocks arranged with the conductive block therebetween and supporting both ends of the probe.

5. The test device according to claim 2, wherein the insulating cover block comprises: a cover main body shaped like a plate; and a probe holder protruding from the cover main body, inserted in the shield tube, and supporting a rear end of the probe inside the shield tube.

6. The test device according to claim 1, wherein the tube accommodating portion is further formed so as to stop before penetrating the insulating block, and the conductive contact portion is further formed so as to stop before penetrating the insulating block.

7. A test device comprising:
a probe supporting block formed with a tube accommodating portion along a test direction;
a conductive shield tube accommodated in the tube accommodating portion; and
a probe accommodated and supported in a shield tube without contacting the shield tube,
wherein the probe supporting block comprises a conductive block and an insulating block, wherein the tube accommodating portion comprises a conductive contact portion for transmitting a ground signal to the shield tube and with which the shield tube is in contact, wherein the insulating block is stacked on one side of the conductive block and supports the shield tube and a first end portion of the probe, wherein the tube accommodating portion is formed so as to penetrate the conductive block from a bottom to a top in the test direction and extends only to a position in the insulating block in the test direction, wherein the conductive shield tube comprises a flange, and wherein the tube accommodating portion comprises a stepped portion in a lower end portion of the conductive block, the stepped portion forming a flange hole, the flange hole abutting the insulating block, the flange hole accommodating the flange.

* * * * *